United States Patent [19]

Hirano et al.

[11] Patent Number: 4,504,328
[45] Date of Patent: Mar. 12, 1985

[54] LIQUID PHASE EPITAXIAL GROWTH TECHNIQUE

[75] Inventors: Ryoichi Hirano; Hirofumi Namizaki; Wataru Susaki; Toshio Tanaka, all of Itami, Japan

[73] Assignee: Mitsubishi Denki Kabushiki Kaisha, Tokyo, Japan

[21] Appl. No.: 534,113

[22] Filed: Sep. 20, 1983

[30] Foreign Application Priority Data

Oct. 12, 1982 [JP]  Japan ................................ 57-180401

[51] Int. Cl.³ ........................................ H01L 21/208
[52] U.S. Cl. ..................................... 148/171; 148/172
[58] Field of Search ................. 148/171, 172; 118/415

[56] References Cited

U.S. PATENT DOCUMENTS

| | | | |
|---|---|---|---|
| 3,909,317 | 9/1975 | Itoh et al. | 148/173 X |
| 3,950,195 | 4/1976 | Rode et al. | 156/622 X |
| 3,960,618 | 6/1976 | Kawamura et al. | 148/172 X |
| 4,028,148 | 6/1977 | Horikoshi | 148/171 |
| 4,338,877 | 7/1982 | Yamanaka et al. | 118/421 |

OTHER PUBLICATIONS

Yoshiji Horikoshi, "A New Liquid Phase Epitaxial Growth", *Japanese J. Appl. Phys.*, vol. 15, No. 5, May 1976, pp. 887 and 888.

*Primary Examiner*—G. Ozaki
*Attorney, Agent, or Firm*—Lowe King Price & Becker

[57] ABSTRACT

A first growth melting solution which has been used for the growth of a first layer is first replaced with a third melting solution and then with a second growth melting solution for the growth of a second layer. Using the third melting solution of a composition intermediate the first and second melting solutions effectively suppresses supersaturate or unsaturation of the solute during replacement of the melting solutions.

8 Claims, 3 Drawing Figures

LIQUID PHASE EPITAXIAL GROWTH TECHNIQUE

BACKGROUND OF THE INVENTION

1. Field of the Invention

This invention relates to a liquid phase epitaxial growth technique, and more particularly to an improved sliding scheme liquid phase epitaxial growth method.

2. Description of the Prior Art

In the recent years, semiconductor devices of III-V compound semiconductor materials have been in increasing use as light emitting devices, microwave oscillators and field effect mode transistors The liquid phase epitaxial growth technique is well known as one way of manufacturing such III-V compound semiconductor crystals. This technique involves bringing a solute in a melting solvent under saturation at a predetermined temperature into contact with a semiconductor crystalline substrate and subsequently decreasing the temperature by a fixed value to permit the supersaturated solute to be deposited on the substrate, thereby forming an epitaxial growth layer.

The above sort of liquid phase epitaxial growth method is generally performed by the sliding scheme liquid phase epitaxial growth technique. Various forms of the sliding scheme liquid phase epitaxial growth technique have been proposed: One approach replaces the growth melting solution which was used for the growth of a certain layer with a new growth melting solution by pushing out the former, for the growth of a subsequent layer. It is generally known that semiconductor devices having a plurality of continously grown epitaxial layers on the substrate fabricated through the above method exhibit a good crystalline structure and interfacial condition because the interfaces between the epitaxial growth layers are always protected with the growth melting solution without contacting an atmospheric gas.

With the sliding type liquid phase epitaxial growth technique, mixing of the melting solutions is however unavoidable in pushing out the melting solution $M_1$ which had been used for the growth with the new melting solution $M_2$. Assume now for the convenience of explanation that a $Al_xGa_{1-x}As$—GaAs—$Al_xGa_{1-x}As$ three-layered structure is to be built up by the expitaxial growth method, and especially, let the growth of the second thin layer of GaAs be considered. It is noted that the melting solution $M_1$ includes a $Al_xGa_{1-x}As$ composition and the melting solution $M_2$ includes a GaAs composition.

A schematic illustration of the solubility of GaAs at three temperatures (typically, 800° C., 805° C. and 810° C.) when Al is added to a Ga solvent is represented in FIG. 1. If a thin GaAs layer of the $Al_xGa_{1-x}As$—GaAs—$Al_xGa_{1-x}As$ structure is to be deposited, it may be considered that the GaAs layer grows at a substantially constant temperature during the course of decreasing the temperature of the furnace because of a very short time of growth of GaAs. Assume that such temperature is 800° C., for example. In FIG. 1, $M_1$ denotes the point where the liquid phase composition of the melting solution is in equilibrium with $Al_xGa_{1-x}As$ at 800° C. and $M_2$ denotes the point where the same is in equilibrium with GaAs at 800° C. When the melting solution $M_2$ mixes into the melting solution $M_1$ in pushing out the latter (i.e., a 1:1 mixture of the melting solutions $M_1$ and $M_2$) a melting solution $M_3$ is identified by the middle point $M_3$ on the line $M_1$-$M_2$. As is clear from FIG. 1, the melting solution $M_3$ includes a composition which become saturated at approximately 807° C. in respect of GaAs. Since the temperature of the melting solution is now 800° C., the melting solution $M_3$ during pushing becomes supersaturated to an extent which corresponds to 7° C., in respect of GaAs.

In the case where the previous melting solution $M_1$ is pushed out and forcedly replaced by the new melting solution $M_2$ in the above manner after the growth of a certain layer, the melting solutions vary in composition continously from the point $M_1$ to the point $M_2$ along the line $M_1$ - $M_2$, while mixing with each other. As the composition varies, the melting solution becomes supersaturated to an extent which corresponds to a region defined by the slant line in FIG. 1 (a region surrounded by the GaAs solubility curve at 800° C. and the line $M_1$ - $M_2$), resulting in undesirable sudden deposition of a layer.

Although the foregoing has set forth the displacement of the $Al_xGa_{1-x}As$ growth melting solution by the GaAs growth melting solution, an undesirable sudden deposition of a layer is similarly observed when the GaAs growth melting solution is replaced with the $Al_xGa_{1-x}As$ growth melting solution.

As noted above, the conventional sliding scheme liquid phase epitaxial growth method entails objectionable sudden deposition of a layer and experiences great difficulties in forming an active layer of less then 0.2 $\mu$m necessary for semiconductor lasers or the like under proper control of layer deposition.

SUMMARY OF THE INVENTION

This invention is directed to a method of sliding scheme liquid phase epitaxial growth by which a heterostructure junction is formed using a melting solution whose solubility of a solute in a solvent thereof is temperature-dependent and varies in a non-linear manner with addition of an additive element. The method involves the steps of: forming a first layer in an epitaxial growth manner with a first melting solution including a first composition of the solute and the additive element in the solvent; and forming a second layer in an epitaxial growth manner after said first melting solution is replaced by a third melting solution or third melting solutions and then by a second melting solution including a second composition of the solute and the additive element in the solvent, each said third melting solution including a third composition of the solute and the additive element in the solvent between the first and second compositions and becoming saturated at the same temperature in respect of the solute as the first and second melting solutions so that supersaturation or unsaturation of the solute in the melting solution is suppressed during displacement of the melting solutions Accordingly, the primary object of the present invention is to provide an improved sliding scheme liquid phase epitaxial growth method which is free from remarkable supersaturation or unsaturation of a solute during displacement of melting solutions.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Before the description of a sliding scheme liquid phase epitaxial growth according to a preferred embodiment of the present invention (called "intermediate method" as defined above) proceeds, the same conditions as discussed above are assumed for easy comparison with the conventional sliding scheme liquid phase epitaxial growth method. In other words, assuming that a $Al_xGa_{1-x}As$—GaAs—$Al_xGa_{1-x}As$ three-layered structure is to be formed in an epitaxial growth manner, the growth of a thin second layer of GaAs will be particularly considered. As stated above, the melting solution $M_1$ pushed out after growth includes a composition of $Al_xGa_{1-x}As$ and the new melting solution includes a composition of GaAs.

In the preferred embodiment of the intermediate method, an additional melting solution $M_m$ is prepared in replacing the melting solution $M_1$ ($Al_xGa_{1-x}As$) by the melting solution $M_2$ (GaAs), which additional melting solution $M_m$ has an $Al$ concentration intermediate those of the melting solutions $M_1$ and $M_2$ and includes a composition capable of saturating at 800° C. in respect of GaAs. Displacement of the melting solutions takes place in the sequence of the melting solutions $M_1 \rightarrow M_m \rightarrow M_2$.

Figure 1:
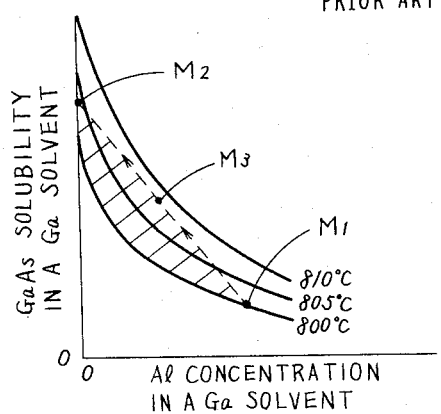
FIG. 1 is a diagram illustrating the solubility of GaAs in a Ga solvent as a function of the concentration of Al added, for explaining the degree of supersaturation during displacement of melting solutions in the conventional sliding scheme liquid phase epitaxial growth method.
Figure 2:
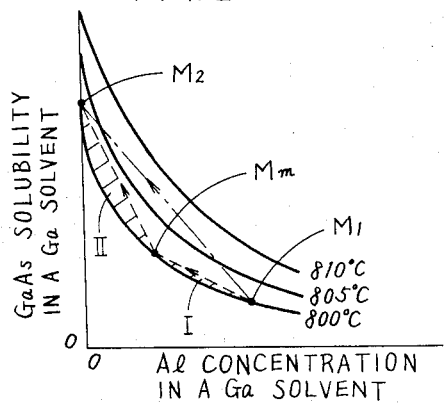
FIG. 2 illustrates a decreased degree of supersaturation during displacement of melting solutions in a sliding scheme liquid phase epitaxial growth method according to an embodiment of the present invention (called "intermediate method" hereinafter)

Referring to FIG. 2, there are plotted three curves of the solubility of GaAs at 800° C., 805° C. and 810° C. like FIG. 1. The melting solution $M_1$ includes a liquid phase composition which is in equilibrium with $Al_xGa_{1-x}As$ at 800° C. and the melting solution $M_2$ includes a liquid phase composition which is in equilibrium with GaAs at 800° C. The composition of $M_1$ may be $Al_xGa_{1-x}As$, while the composition of $M_2$ may be $Al_yGa_{1-y}As$ where $0<x<1$, and $0 \leq y<1$ and $x>y$, or where $0 \leq x<1$, $0<y<1$ and $x<y$. Since the additional melting solution $M_m$ is capable of saturating at 800° C. in respect of GaAs as described previously, the melting solution $M_m$ is seated on the solubility curve at 800° C. The amount of supersaturated GaAs due to the mixing of the two melting solutions $M_1$ and $M_m$ in pushing out and replacing the melting solution $M_1$ by the melting solution $M_m$ is represented by a slant line region I in FIG. 2. Likewise, the amount of supersaturated GaAs due to the mixing of the two melting solutions $M_m$ and $M_2$ in pushing out and replacing the intermediate melting solution $M_m$ by the melting solution $M_2$ is represented by a slant line region II in FIG. 2. The amount of supersaturated GaAs in replacing the melting solutions in the order of $M_1 \rightarrow M_m \rightarrow M_2$ is, therefore, equal to the sum of the slant line regions I and II in FIG. 2.

It will be readily understood from comparison between the slant line region in FIG. 1 (that is, the amount of supersaturated GaAs in the conventional sliding scheme liquid phase epitaxial growth method) and the sum of the slant line regions I and II in FIG. 2 (that is, the amount of supersaturated GaAs in the intermediate method) that the amount of supersaturated GaAs in the latter method is extremely small as compared with that in the former method. As a result, the intermediate method very effectively suppresses deposition of a GaAs layer which otherwise would occur due to supersaturation during displacement of the melting solutions, thus permitting growth of a thin layer of GaAs.

Generally speaking, deposition of a thin layer is possible under proper control with the intermediate method since it prevents objectionable deposition of a layer due to supersaturation during displacement of the melting solutions. Furthermore, whereas change in the composition at the interface bears a gentle gradient due to appreciable supersaturation during displacement of the melting solutions in the conventional method, the intermediate mathod suppresses such supersaturation so that change in the composition at the interface becomes sharp.

With regard to the growth of an $Al_xGa_{1-x}As$ layer of a $Al_yGa_{1-y}As$—$Al_xGa_{1-x}As$—$Al_yGa_{1-y}As$ structure, comparison between the conventional method and the intermediate method from an equilibrium diagram at $y=0.5$, $X=0.2$ and a growth temperature of 800° C. revealed that the amount of supersaturated GaAs in the latter method was reduced to about one third or fourth of that in the former method. Although the growth of an $Al_xGa_{1-x}As$ layer less than 0.15 μm was impossible with the conventional method, the intermediate method allows and properly controls the growth of $Al_xGa_{1-x}As$ layers less than 0.15 μ m thick.

While only one melting solution of the intermediate composition is used in the above embodiment, it is obvious to those skilled in the art that two or more intermediate melting solutions with different compositions may be used to further suppress the amount of supersaturation.

Figure 3:
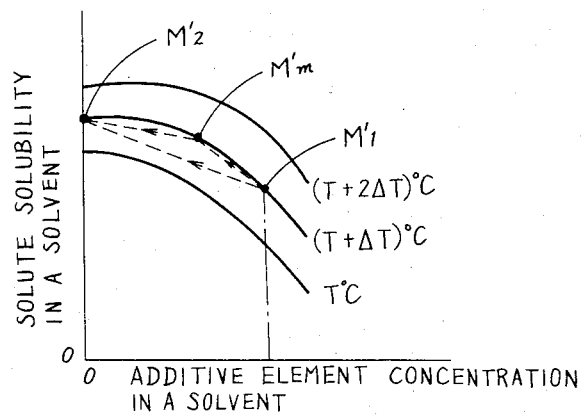
FIG. 3 illustrates a decreased degree of unsaturation during displacement of melting solutions in another preferred form of the intermediate method.

Furthermore, while the foregoing has discussed the problem with supersaturation of the melting solutions during displacement of the melting solutions as depicted in FIGS. 1 and 2, the intermediate method is apparently applicable to unsaturation of the melting solutions during displacement thereof. It is evident from FIG. 3 that the amount of unsaturation when substitution of the melting solutions takes place in the order of the melting solutions $M_1' \rightarrow M_m' \rightarrow M_2'$ may be smaller than when the melting solution $M_1'$ is replaced directly by the melting solution $M_2'$. While the conventional method had the problem of meltback of the growth layers during displacement of the melting solutions, the intermediate method according to the present invention offers the advantage of minimizing such meltback.

In addition, while the foregoing has discussed the formation of a heterostructure junction of a GaAs - AlGaAs system, the intermediate method is further applicable for epitaxial growth of III-V compound semiconductors other than GaAs (typically, InP) and compound semiconductors other than III-V compound ones. In general, the intermediate method is applicable in all cases where the solubility of the solute in the solvent varies with the amount of the additive element and such variation exhibits a non-linear relationship.

It is already noted that the foregoing has set forth the sliding scheme epitaxial growth method of the type wherein the melting solution is pushed out by another melting solution. Since the mixing of the previous melting solution and the new one is more or less unavoidable in other forms of the sliding scheme epitaxial growth method, the method according to the present invention is equally useful and effective in such a case.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of sliding scheme liquid phase epitaxial growth for forming a heterostructure junction using a melting solution whose solubility of a solute in a solvent thereof is temperature-dependent and varies in a non-linear manner with addition of an additive element, said method comprising the steps of:

forming a first layer in an expitaxial growth manner with a first melting solution including a first composition of said solute and said additive element in the solvent; and forming a second layer in an epitaxial growth manner after said first melting solution is replaced by at least one third melting solution and then by a second melting solution including a second composition of said solute and said additive element in said solvent, each said third melting solution including a third composition of said solute and said additive element in said solvent between said first and second compositions and becoming saturated at the same temperature in respect of said solute as said first and second melting solutions thereby suppressing supersaturation or unsaturation of said solute in said melting solution during displacement of said melting solutions.

2. A method as set forth in claim 1 wherein said displacement of said melting solutions is carried out by pushing out one of said melting solutions by the following one of said melting solutions.

3. A method as set forth in claim 1 wherein said solute comprises a semiconductor compound; and said additive element comprises a dopant.

4. A method as set forth in claim 1 wherein said solute comprises a group III–V semiconductor compound.

5. A method as set forth in claim 4 wherein said group III–V semiconductor compound is gallium arsenide (GaAs); and said additive element is aluminum (Al).

6. A method as set forth in claim 5 wherein said first composition is $Al_xGa_{1-x}As$; and said second composition is $Al_yGa_{1-y}As$ where $0<x<1$, $0\leq y<1$ and $x>y$ or where $0\leq x<1$, $0<y<1$ and $x<y$.

7. A method as set forth in claim 4 wherein said group III–V semiconductor compound is indium phosphide (InP); and said additive element is gallium (Ga) and/or arsenic (As).

8. In a method of epitaxially forming a multilayered structure having a heterostructured junction between group III–V semiconductor compounds by providing a first melting solvent becoming saturated at a first temperature and having a first composition including group III–V semiconductor compounds and an additive in contact with a crystalline substrate, decreasing the temperature of the first solvent below said first temperature to a second temperature to deposit the supersaturated composition including group III–V compound semiconductors and said additive on said substrate, and displacing said first melting solvent by providing a second melting solvent having a second composition including group III–V semiconductor compounds which may include said additive, said second melting solvent being capable of saturation or supersaturation at said second temperature, the improvement comprising the step of suppressing supersaturation and unsaturation of the group III–V semiconductor compounds in said melting solvents during displacement of said melting solvents, said suppressing step comprising the further step of providing a further solution of said group III–V semiconductor compounds having a concentration of said additive intermediate concentrations thereof in said first and second melting solvents.

* * * * *